United States Patent [19]

Kurita et al.

[11] Patent Number: 5,221,641
[45] Date of Patent: Jun. 22, 1993

[54] PROCESS FOR MAKING LIGHT EMITTING DIODES

[75] Inventors: Yoshio Kurita; Yuji Sakamoto; Atsushi Imai, all of Kyoto, Japan

[73] Assignee: Rohm Co., Ltd., Kyoto, Japan

[21] Appl. No.: 888,509

[22] Filed: May 27, 1992

[30] Foreign Application Priority Data

Jun. 21, 1991 [JP] Japan .................................. 3-150321
Aug. 30, 1991 [JP] Japan .................................. 3-219980

[51] Int. Cl.$^5$ .................... H01L 21/56; H01L 21/60
[52] U.S. Cl. .................................... 437/211; 437/23; 437/209; 148/DIG. 99
[58] Field of Search ............... 437/23, 211, 209; 148/DIG. 99

[56] References Cited

U.S. PATENT DOCUMENTS

| | | | |
|---|---|---|---|
| 2,444,440 | 5/1969 | Bell et al. | 437/211 |
| 3,820,237 | 6/1974 | Effer | 437/211 |
| 3,939,488 | 2/1976 | Wakashima et al. | 437/211 |
| 4,209,358 | 6/1980 | DiLeo et al. | 437/211 |
| 4,326,771 | 4/1982 | Henry et al. | 437/211 |
| 4,407,057 | 10/1983 | Kimura et al. | 637/211 |
| 4,707,724 | 11/1987 | Suzuki et al. | 437/211 |

FOREIGN PATENT DOCUMENTS

| | | | |
|---|---|---|---|
| 61-75570 | 4/1986 | Japan | 437/23 |
| 62-252181 | 11/1987 | Japan | 437/23 |

Primary Examiner—Brian E. Hearn
Assistant Examiner—Kevin M. Picardat
Attorney, Agent, or Firm—William H. Eilberg

[57] ABSTRACT

A process is provided for making light emitting diodes by using wire segments each plated with a glossy metal. The process comprises the steps of bending each wire segment generally into a U-shape to have a pair of legs connected together by an integral connecting web, deforming the free end of one leg by transverse compression to provide a cup end, mounting a semiconductor chip in the cup end, connecting the semiconductor chip to the free end of the other leg through a wire, forming a transparent or semitransparent resin package to enclose the respective free ends of the paired legs, and cutting the connecting web off the wire segment.

9 Claims, 7 Drawing Sheets

PROCESS FOR MAKING LIGHT EMITTING DIODES

BACKGROUND OF THE INVENTION

1. Field of the Invention

This invention relates generally to light emitting diodes known commonly as "LED". More particularly, the present invention relates to a process for making LED's of the type wherein one of paired leads has a cup end with a reflective inner surface for mounting a semiconductor chip to effectively emit light through a transparent or semitransparent resin package.

2. Description of the Prior Art

Conventionally, LED's of the above-mentioned type are typically manufactured by using a leadframe which is punched out from a thin metallic plate, as disclosed in Japanese Patent Application Laid-open No. 59-229884 for example. The leadframe has pairs of leads arranged at constant pitch.

In the manufacturing process utilizing the leadframe, the pairs of leads are cut off at the final stage of the process, and the remaining portion of the leadframe is discarded. Thus, the use of the leadframe inevitably has a problem of material waste, consequently leading to a cost increase.

In an attempt to reduce the production cost, the inventors have previously proposed the use of a metallic wire as a material for LED leads, as disclosed in Japanese Patent Application Laid-open Nos. 3-27540 and 3-50747.

In this known process, specifically, the material wire is first subjected to axial compression at a forward end thereof to provide a cup end, and a portion of the wire including the cup end is cut off to provide a wire segment of a predetermined length. This operation is repeated until the material wire is exhausted, thereby providing a plurality of similar wire segments.

Then, each of the wire segments is bent into an elongate U-shape to have a pair of legs connected together through an integral connecting web. One of the paired legs has the cup end. The respective U-shaped wire segments are thereafter attached to a carrier band for collective transfer and handling.

During transfer, a semiconductor chip is mounted in the cup end of the one leg of each wire segment, and the chip is connected to the other leg through a thin wire. Then, a transparent or semitransparent resin package is formed, by using a suitable mold, to enclose the respective free ends of the paired legs. Finally, the connecting web is cut off from the wire segment.

The above prior art process is advantageous in avoiding material waste because substantially the entire portion of the material wire is used to make leads. However, the prior art process is still disadvantageous in the following respects.

First, the inner surface of the lead cup end is required to work as a reflective mirror surface for effectively emitting light. With the prior art process, however, since the cup end is formed by axially compressing a cut end (forward end) of the material wire, the core wire metal is inevitably exposed at the inner surface of the cup end even if the material wire is previously plated with a glossy metal. Thus, it is necessary to provide an additional step of forming a glossy coating or plating on the inner surface of the cup end, consequently resulting in a production cost increase.

Secondly, when the cup end is formed by axially compressing the material wire endwise, there is a limitation on the design freedom in selecting the size and shape of the cup end. This is partly because of the limited diametrical expansibility of the material wire and partly because of the fact that the wire buckles easily at the time of axial compression unless a portion of the wire subjected to axial compression is kept small.

SUMMARY OF THE INVENTION

It is, therefore, an object of the present invention to provide an LED making process which is capable of forming a cup end of a lead with a reflective or mirror inner surface without requiring an additional coating or plating step.

Another object of the present invention is to provide an LED making process which is capable of increasing the design freedom with respect to the size and shape of the lead cup end.

A further object of the present invention is to provide an LED making process capable of reducing quality and yield deterioration which would result from wire bonding failures.

According to the present invention, there is provided a process for making light emitting diodes by using wire segments each plated with a glossy metal, the process comprising the steps of: bending each wire segment generally into a U-shape to have a pair of legs connected together by an integral connecting web, each leg having a free end; deforming the free end of one leg by compression transversely thereof to provide a cup end; mounting a semiconductor chip in the cup end of said one leg; connecting the semiconductor chip to the free end of the other leg through a wire; forming a transparent or semitransparent resin package to enclose the respective free ends of the paired legs; and cutting the connecting web off said each wire segment.

With the process described above, the cup end is formed by transversely compressing the free end of the one leg. As a result, a portion of the originally plated surface of the wire segment constitutes the inner surface of the cup end which therefore is a reflective mirror surface. Thus, there is no need to perform an additional coating or plating step, thereby realizing simplification and cost reduction of the manufacturing process.

Further, compared with the prior art wherein the free end of a wire segment leg is axially compressed, transverse compression makes it possible to increase the design freedom in choosing the size and shape of the cup end.

Preferably, the formation of the cup end is performed in two steps which include flattening the free end of said one leg, and then deforming the flattened free end into a cup shape. Obviously, such two-step compression is effective for further increasing the freedom in selecting the size and shape of the cup end.

It is further advantageous if a resinous bridge is formed between the respective free ends of the paired legs at least prior to connecting the semiconductor chip to said other leg. The bridge functions to fix the relative position between the respective free ends of the paired legs, so that the subsequent wire bonding can be performed with a higher reliability to increase the yield.

Other objects, features and advantages of the present invention will become apparent from the following detailed description of the preferred embodiment given with reference to the accompanying drawings.

DETAILED DESCRIPTION OF THE PREFERRED EMBODIMENTS

Figure 1:
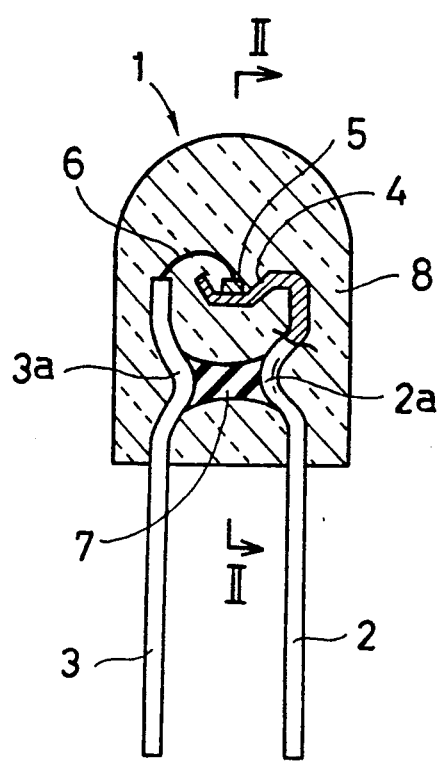
FIG. 1 is a front view, in vertical section, showing a light emitting diode which is made by the process of the present invention.

Referring first to FIG. 1 of the accompanying drawings, there is shown a light emitting diode 1 which is made by the process according to the present invention. The diode 1 comprises a pair of leads 2, 3. For the convenience of the following description, one lead 2 is referred to as "first lead", whereas the other lead 3 is referred to as "second lead".

Figure 2:
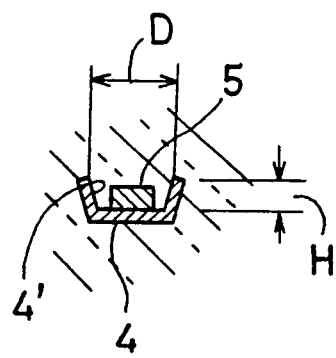
FIG. 2 is a fragmentary sectional view taken along lines II—II in FIG. 1.

The first lead 2 has an integral cup end 4 having a diameter D and a depth H (see FIG. 2). The cup end 4 is used for receiving and mounting a semiconductor chip 5 which is connected to the second lead 3 through a thin metallic wire 6.

The first lead 2 has a curved portion 2a bulging toward the second lead 3 adjacent the cup end 4. Likewise, the second lead 3 also has a corresponding curved portion 3a bulging toward the first lead 2. A resinous bridge 7 connects between the respective curved portions 2a, 3a of the first and second leads for fixing the leads relative to each other. A transparent or semitransparent resin package 8, which itself acts as a lens, partially encloses the respective leads together with the semiconductor chip 5, the metallic wire 6 and the resinous bridge 7.

The light emitting diode 1 described above is made by the following process.

Figure 3:
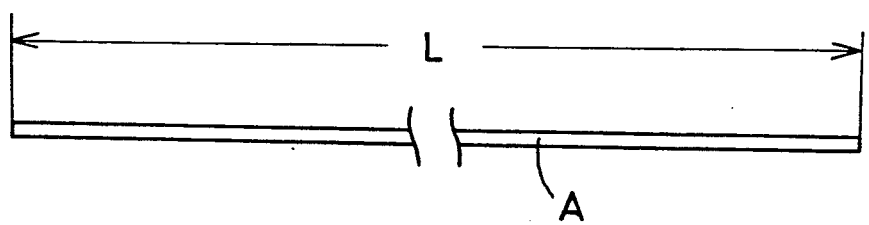
FIG. 3 is a view, partly cut away, showing a wire segment from which the process of the present invention start.

First, a metallic wire segment A is cut from a longer material wire to have a predetermined length L, as shown in FIG. 3. The material wire is made of carbon steel for example and plated with a glossy metal such as silver or solder.

Figure 4:
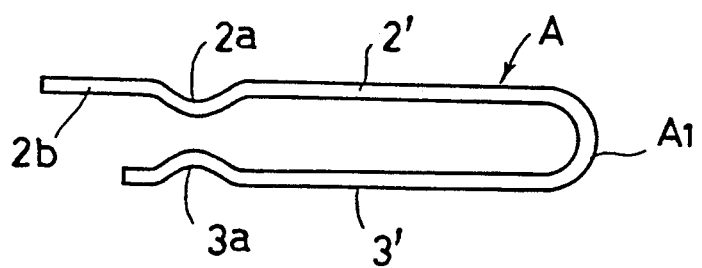
FIG. 4 is a view showing the wire segment after bending into a U-shape.

Then, the wire segment A is bent into an elongate U-shape to have a first leg 2' and a second leg 3' integral with the first leg via a connecting web A1, as shown in FIG. 4. At the time of bending, the first leg 2' is rendered slightly longer than the second leg 3', so that the first leg is made to have an excess end 2b. Further, the respective legs 2', 3' are formed to have corresponding curved portions 2a, 3a. Obviously, the first and second legs 2', 3' correspond to the first and second leads 2, 3 (see FIG. 1), whereas the excess end 2b of the first leg is used for subsequently forming the cup end 4 (see also FIG. 1).

Figure 5:
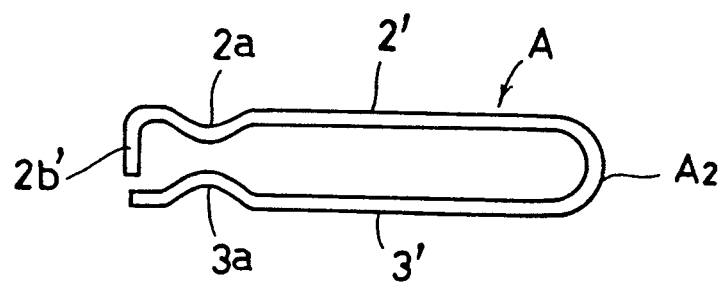
FIG. 5 is a view showing the wire segment which has been subjected to an additional bending operation.

Then, the excess end 2b of the first leg 2' is bent toward the second leg 3', as shown in FIG. 5.

Figure 6:
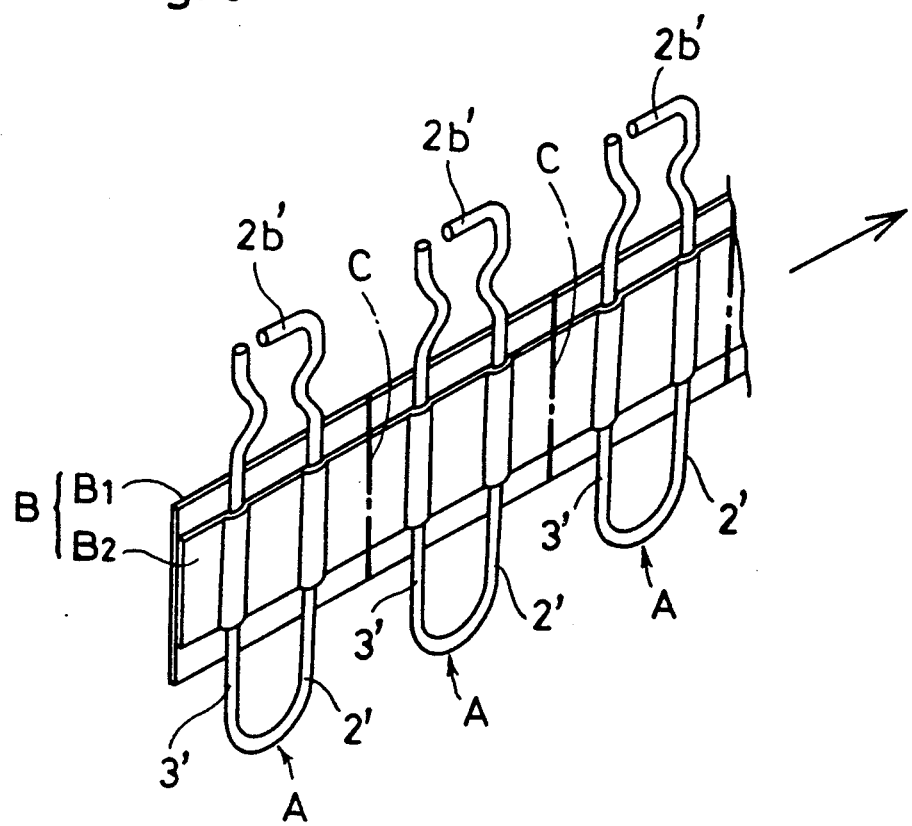
FIG. 6 is a perspective view showing the wire segment as attached to a carrier band together with other similar wire segments.

Then, a plurality of thus bent wire segments A are attached to a flexible carrier band B at a constant pitch longitudinally thereof, as shown in FIG. 6. The carrier band B includes a support tape B1 and a fixing tape B2 having one surface coated with a layer of pressure sensitive adhesive for attachment to the support tape B1, and the wire segments A are held between the respective tapes B1, B2. Each of the tapes B1, B2 may be made of an insulating flexible material such as soft synthetic resin or paper. The carrier band B together with the supported wire segments A is transferred in the longitudinal direction of the band with the respective excess ends 2b directed upward. Indicated by reference sign C are bending lines for facilitating bending of the band during transfer, as more specifically described later.

During transfer of the carrier band B, each of the wire segments A undergoes the following successive stages of the process.

Figure 7:
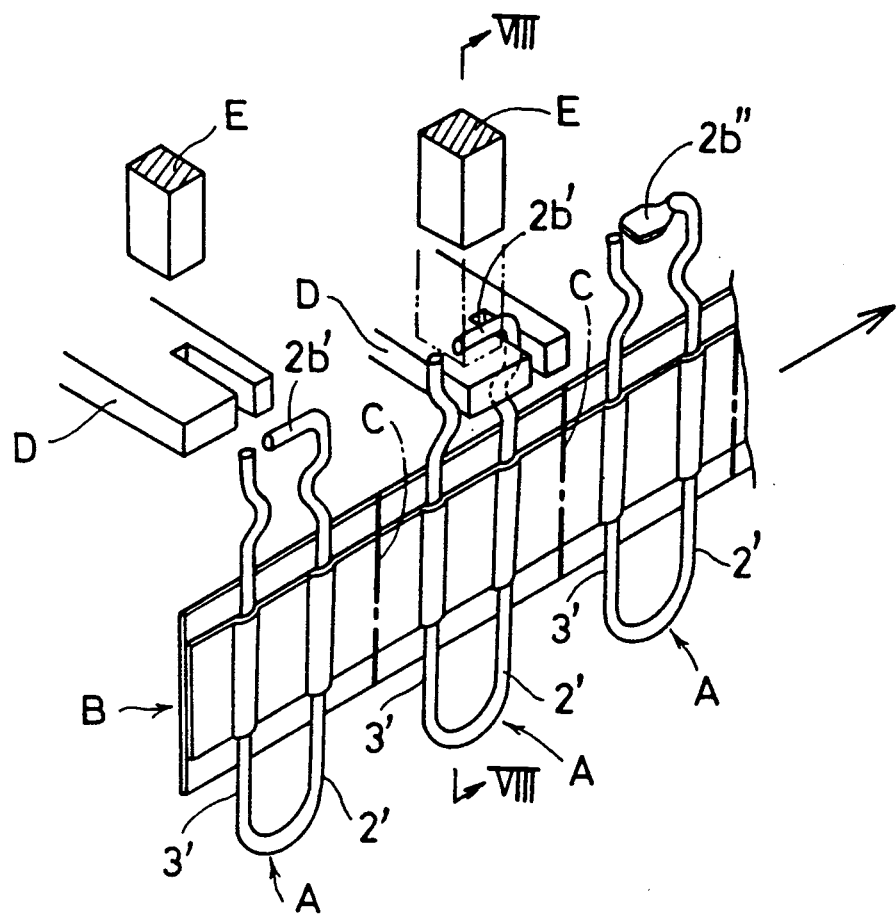
FIG. 7 is a perspective view showing a flattening stage.
Figure 8:
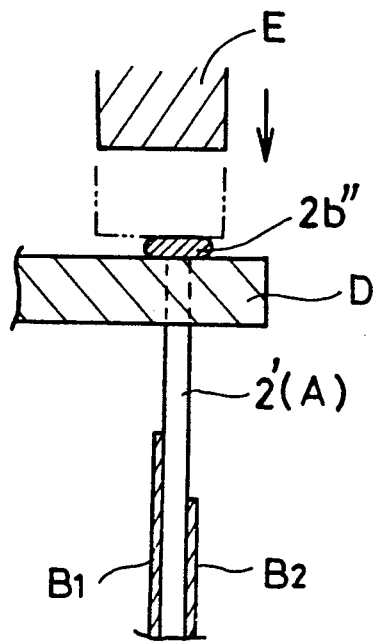
FIG. 8 is a sectional view taken along lines VIII—VIII in FIG. 7.

In a first stage, a support die D is inserted between the respective legs 2', 3' of each wire segment A immediately under the bent excess end 2b', and a pressing die E is pressed against the bent excess end 2b', as shown in FIGS. 7 and 8. As a result, the bent excess end 2b' is compressed transversely (diametrically) thereof to provide a flattened end 2b".

Figure 9:
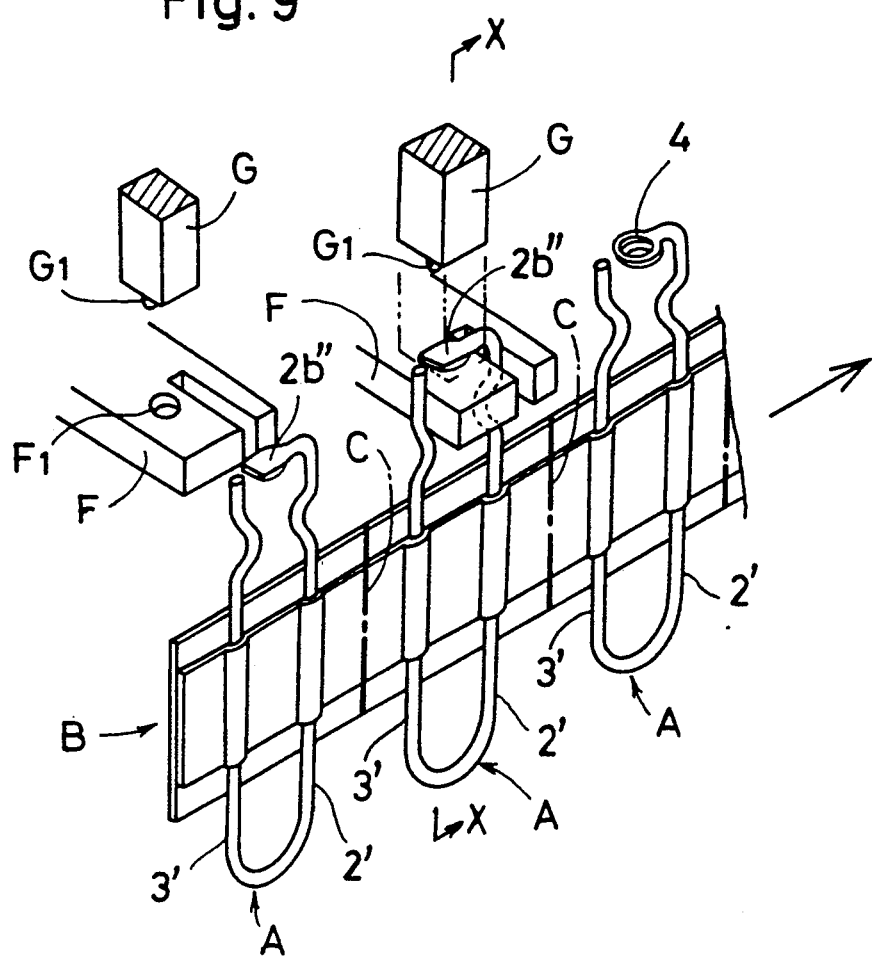
FIG. 9 is a perspective view showing a cup forming stage.
Figure 10:
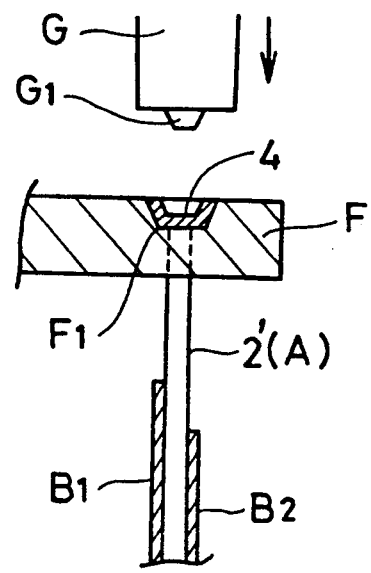
FIG. 10 is a sectional view taken along lines X—X in FIG. 9.

In a second stage which is performed downstream from the position of the first stage, another support die F having a recess F1 is inserted between the respective legs 2', 3' of each wire segment A immediately below the flattened end 2b", and another pressing die G having a complementary projection G1 is pressed against the flattened end 2b", as shown in FIGS. 9 and 10. Obviously, at this time, the flattened end 2b" is aligned with the recess G1 and the projections F1. As a result, the flattened end 2b" is further deformed to provide a cup end 4.

Figure 11:
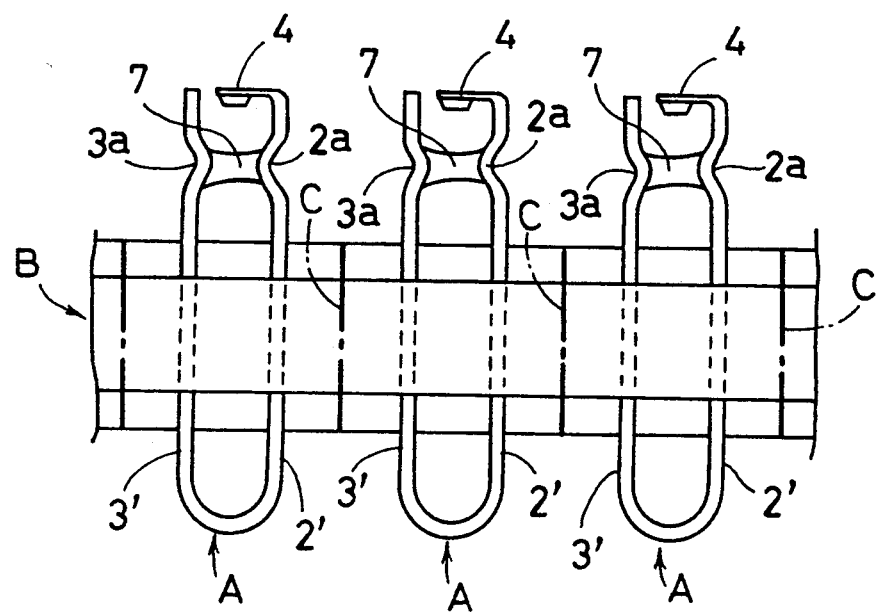
FIG. 11 is a front view showing a bridge forming stage.

In a third stage which is performed downstream from the position of the second stage, a resinous bridge 7 is formed between the respective leg curved portions 2a, 3a of each wire segment A by depositing in situ a suitable amount of fluid resin and causing it to harden, as shown in FIG. 11. A suitable example of fluid resin is an ultraviolet hardening resin which hardens upon ultraviolet irradiation, but a different resin such as thermosetting resin is also usable.

Figure 12:
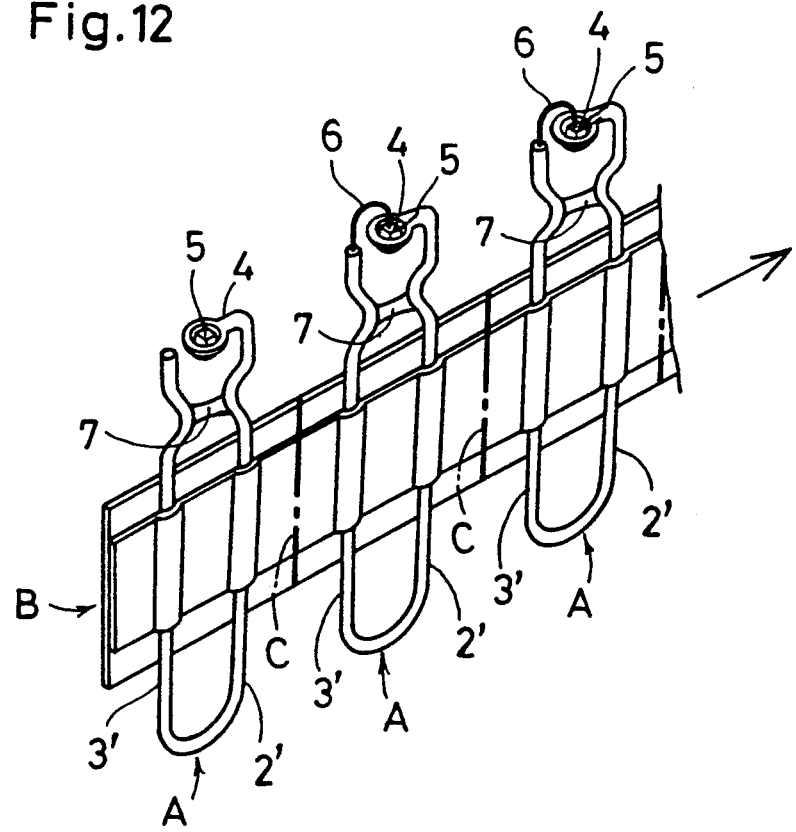
FIG. 12 is a perspective view showing a stage for chip mounting and wire bonding.

A fourth stage is performed downstream from the position of the third stage by using a chip bonding apparatus (not shown) and a wire bonding apparatus (not shown). Specifically, in this stage, a semiconductor chip 5 is mounted in the cup end 4 of the first leg 2' of each wire segment A, and the chip is electrically connected to the second leg 3' through a thin metallic wire 6, as shown in FIG. 12.

Figure 13:
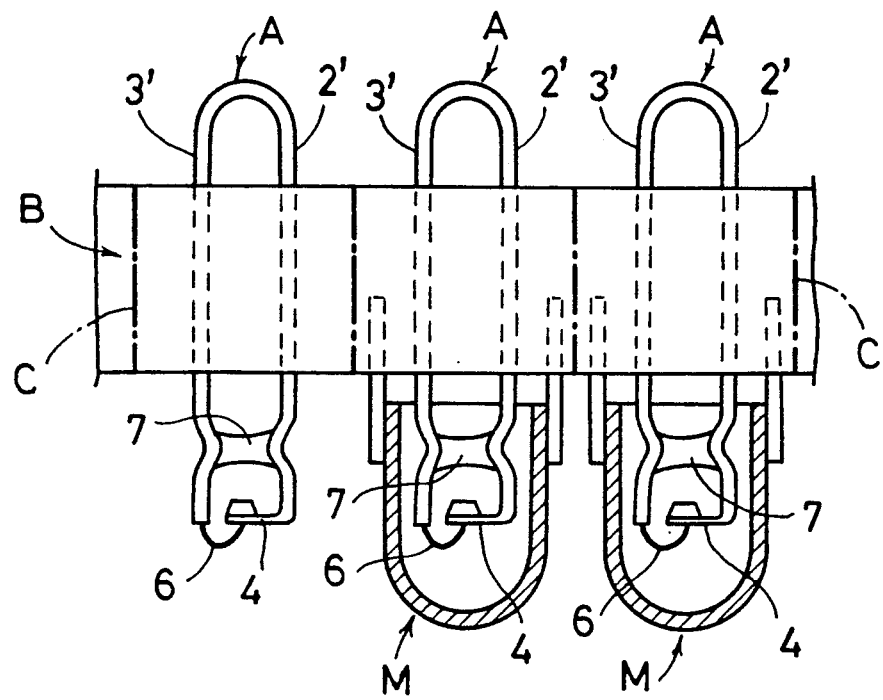
FIG. 13 is a front view showing a molding stage.

In a fifth stage which is performed downstream from the position of the fourth stage, a portion of the carrier band B advancing into the fifth stage is turned over by twisting through 180°, so that the cup end 4 of each wire segment A is directed downward, as shown in FIG. 13. Then, a mold M is removably attached to the carrier band B with a relevant portion of the wire segment inserted therein.

Figure 14:
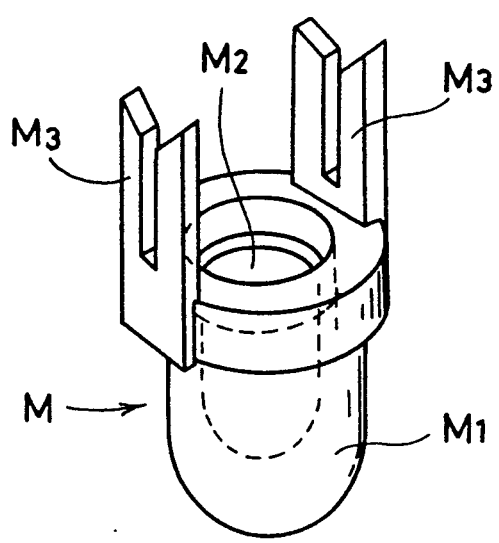
FIG. 14 is a perspective view showing a mold used for the molding stage.

As shown in FIG. 14, the mold M, which is made of polypropyrene for example, has a main body M1 with a molding cavity M2, and a pair of clips M3 on both sides of the main body. The clips M3 are engageable with the carrier band B for removable attachment of the mold M relative to the band.

Figure 15:
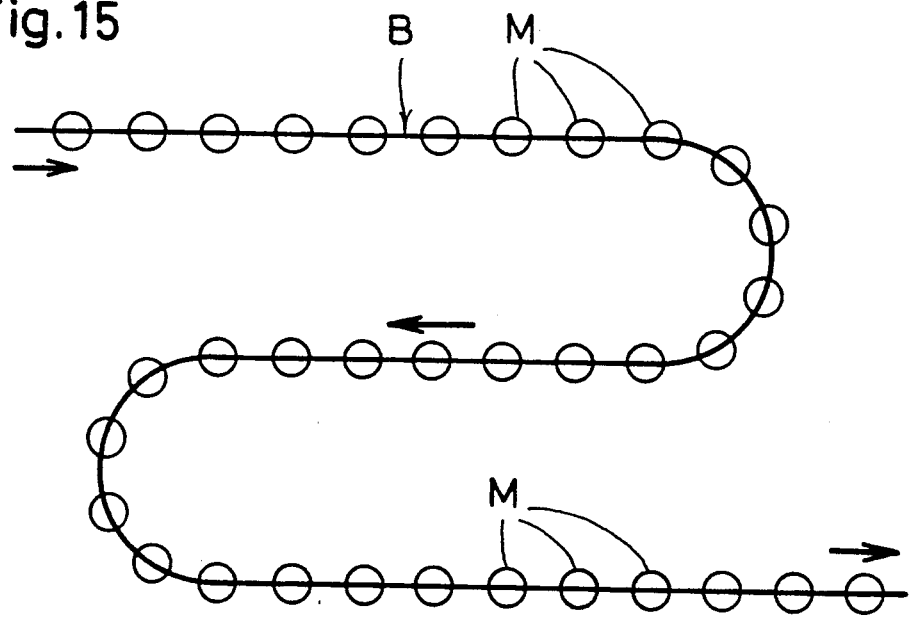
FIG. 15 is a schematic plan view showing a resin hardening stage.

In a sixth stage which is conducted downstream from the position of the fifth stage, a fluid transparent or semitransparent resin (not shown) is loaded into each mold M. Then, the resin is allowed to harden while the carrier band B is made to move along a tortuous or serpentine path, as shown in FIG. 15. Because hardening of the resin requires a relatively long time (i.e. a relatively long path), the tortuous transfer path is preferred to reduce the size of the manufacturing apparatus while ensuring an enough curing time. The mold M is removed upon completion of such hardening, and a resin package 8 (see FIG. 1) will result.

Figure 16:
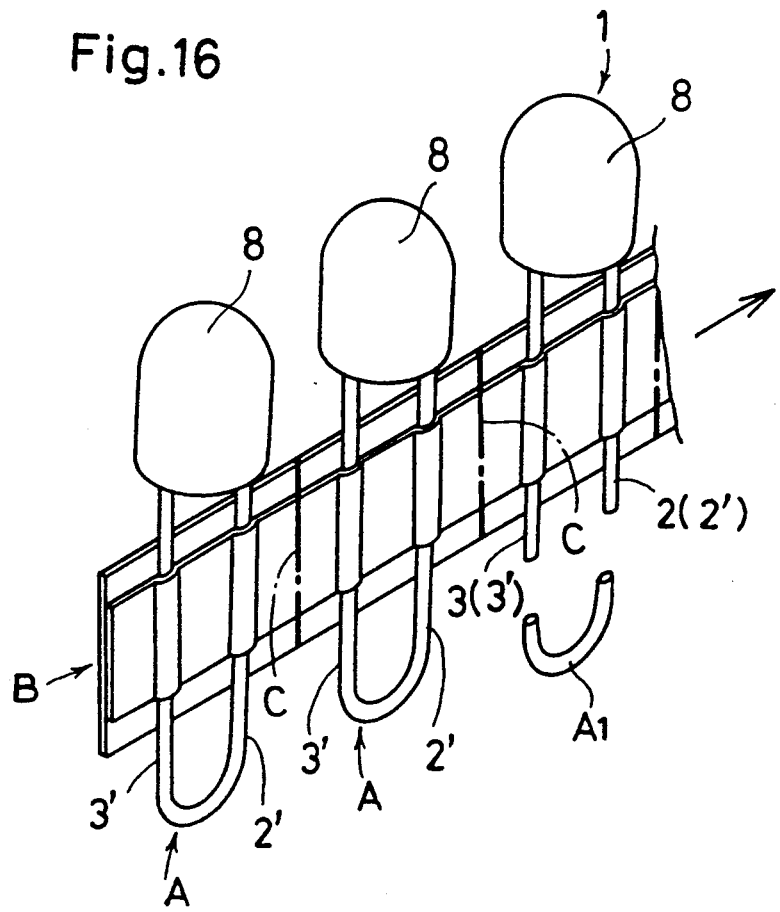
FIG. 16 is a perspective view showing a finalizing stage of the process.

In a last (seventh) stage which is performed downstream from the position of the sixth stage, a connecting web A1 is cut off from each wire segment A, and the resulting diode 1 is checked for its performance by applying a voltage across the respective leads 2, 3 (previously the legs 2', 3'), as illustrated in FIG. 16.

The product diodes thus obtained may be separated from the carrier band B for shipment or handling. Alternatively, due to the flexible nature of the carrier band B, the products may be shipped or handled collectively while they are held by the band.

According to the process of the present invention, the bent excess end 2b' of each first leg 2' is first flattened by compressing transversely or diametrically thereof (FIGS. 7 and 8), and the flattened end 2b'' is then deformed into a cup shape (FIGS. 9 and 10). Thus, the resulting cup end 4 can be made to have a reflective inner surface 4' (see FIG. 2) by utilizing a portion of the original plated surface of the wire segment, hence no necessity to provide an additional coating or plating step for the cup end. Further, the preliminary formation of the flattened end 2b'' enables sufficiently enlarging the diameter D and depth H (see FIG. 2) of the cup end in addition to increasing the design freedom in choosing the shape of the cup end.

The resinous bridge 7, which is formed as a result of the process stage shown in FIG. 11, functions to fix the relative position between the respective legs 2', 3' of each wire segment A during and after the subsequent wire bonding stage (FIG. 12), thus preventing a deterioration of yield and product quality. Further, the provision of the curved portions 2a, 3a reduces the length of the bridge 7, thereby enhancing the fixing function of the bridge in addition to reducing the amount of fluid resin required for the bridge.

As described in connection with FIG. 15, the carrier band 8 is made to move along a tortuous path, so that the carrier band is greatly bent at the points of directional change. Thus, it is feared that such bending of the band may result in a positional deviation between each pair of legs 2', 3' as well as between the pair of legs and the mold M, consequently leading to a quality deterioration.

However, according to the illustrated embodiment, the bending lines C are formed on the carrier band B at constant pitch for providing points of easy bending. Thus, the band can move along the tortuous path by bending locally at the bending lines but not at positions between the bending lines, thereby preventing or reducing quality deterioration.

In the illustrated embodiment, bending of the excess end 2b of the first leg 2' is performed before attaching each wire segment A onto the carrier band B (see FIGS. 4 and 5). However, the excess end of the first leg may be bent after the wire segment is attached to the carrier band.

On the other hand, the process steps up to the formation of the cup end 4 (FIGS. 3 through 10) or up to the formation of the resinous bridge 7 (FIGS. 3 through 11) may be performed before each wire segment A is attached to the carrier band B. Further, the resinous bridge 7 may be formed after the semiconductor chip 5 is mounted in the cup end 4 of the wire segment.

According to the illustrated embodiment, the formation of the cup end 4 is performed in two separate steps which include flattening the bent excess end 2b' of the first leg 2' and deforming the flattened end 2b'' into a cup shape. However, the cup end 4 may be formed in a single step of deforming the bent excess end 2b' by transverse or diametrical compression.

Moreover, the process of the present invention is applicable to a light emitting diode of the type wherein the generated light is emitted laterally. In this case, the first leg 2' of the wire segment A need not be made to have an excess end 2b which is subsequently bent.

The present invention being thus described, it is obvious that the same may be varied in many other ways. Such variations are not to be regarded as a departure from the spirit and scope of the the invention, and all such modifications as would be obvious to those skilled in the art are intended to be included within the scope of the following claims.

We claim:

1. A process for making light emitting diodes by using wire segments each plated with a glossy metal, the process comprising the steps of:

bending each wire segment generally into a U-shape to have a pair of legs connected together by an integral connecting web, each leg having a free end;

deforming the free end of one leg by compression transversely thereof to provide a cup end;

mounting a semiconductor chip in the cup end of said one leg;

connecting the semiconductor chip to the free end of the other leg through a wire;

forming a transparent or semitransparent resin package to enclose the respective free ends of the paired legs; and cutting the connecting web off said each wire segment, wherein a resinous bridge is formed between the respective free ends of the paired legs at least prior to connecting the semiconductor chip to said other leg.

2. The process according to claim 1, wherein the formation of the cup end is performed by the steps of first flattening the free end of said one leg, and then deforming the flattened free end into the end cup.

3. The process according to claim 1, wherein at least one free end of the paired legs is formed with a curved portion projecting toward the other free end of the paired legs, the resinous bridge being made to extend between the curved portion and said other free end.

4. The process according to claim 1, wherein the resinous bridge is made of a ultraviolet hardening resin.

5. The process according to claim 1, wherein said each wire segment is held by a carrier band at least prior to mounting the semiconductor chip in the cup end.

6. The process according to claim 5, wherein the formation of the resin package is performed by the steps of:

attaching a removable mold to the carrier band to receive the respective free ends of the paired legs; loading an amount of fluid resin into the mold; and causing the fluid resin to harden.

7. The process according to claim 6, wherein hardening of the fluid resin is performed while the carrier band moves along a tortuous path.

8. The process according to claim 7, wherein the carrier band is provided with bending lines at a predetermined pitch.

9. The process according to claim 1, wherein said one leg is longer than said other leg to have an excess end which is the free end of said one leg, the excess end being bent toward said other leg prior to forming the cup end.

* * * * *